(12) United States Patent
Gervais et al.

(10) Patent No.: US 6,792,554 B2
(45) Date of Patent: Sep. 14, 2004

(54) METHOD AND SYSTEM FOR SYNCHRONOUSLY TRANSFERRING DATA BETWEEN CLOCK DOMAINS SOURCED BY THE SAME CLOCK

(75) Inventors: Gilles Gervais, Austin, TX (US); Stephen Douglas Weitzel, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 566 days.

(21) Appl. No.: 09/734,119

(22) Filed: Dec. 11, 2000

(65) Prior Publication Data

US 2003/0037273 A1 Feb. 20, 2003

(51) Int. Cl.[7] ............................................... G06F 1/04
(52) U.S. Cl. ........................ 713/600; 713/401; 713/501
(58) Field of Search ................................ 713/400, 401, 713/500, 501, 600; 327/105, 107, 141, 144, 147; 710/305

(56) References Cited

U.S. PATENT DOCUMENTS

| | | | | |
|---|---|---|---|---|
| 5,256,912 A | * | 10/1993 | Rios | 327/144 |
| 5,915,107 A | * | 6/1999 | Maley et al. | 713/400 |
| 6,049,887 A | * | 4/2000 | Khandekar et al. | 713/503 |
| 6,175,603 B1 | * | 1/2001 | Chapman et al. | 375/354 |
| 6,359,479 B1 | * | 3/2002 | Oprescu | 327/141 |
| 6,446,180 B2 | * | 9/2002 | Li et al. | 711/167 |
| 6,535,946 B1 | * | 3/2003 | Bryant et al. | 710/305 |

* cited by examiner

Primary Examiner—Thomas Lee
Assistant Examiner—Thuan Du
(74) Attorney, Agent, or Firm—Duke W. Yee; Robert M. Carwell; Lisa L. B. Yociss

(57) ABSTRACT

A method and system for controlling a clock signal is provided. The clock signal is first stored in a storage device. An input representing a clock control signal is input into a first end of a plurality of interconnected memory storage circuits. An outputted clock signal is output from a second end of the plurality of interconnected memory storage circuits based on receipt of the pulse representing the clock control signal. In one embodiment, the plurality of interconnected memory storage circuits is comprised of latches. In an alternate embodiment, the plurality of interconnected memory storage circuits is comprised of latches and master/slave flip-flops.

20 Claims, 10 Drawing Sheets

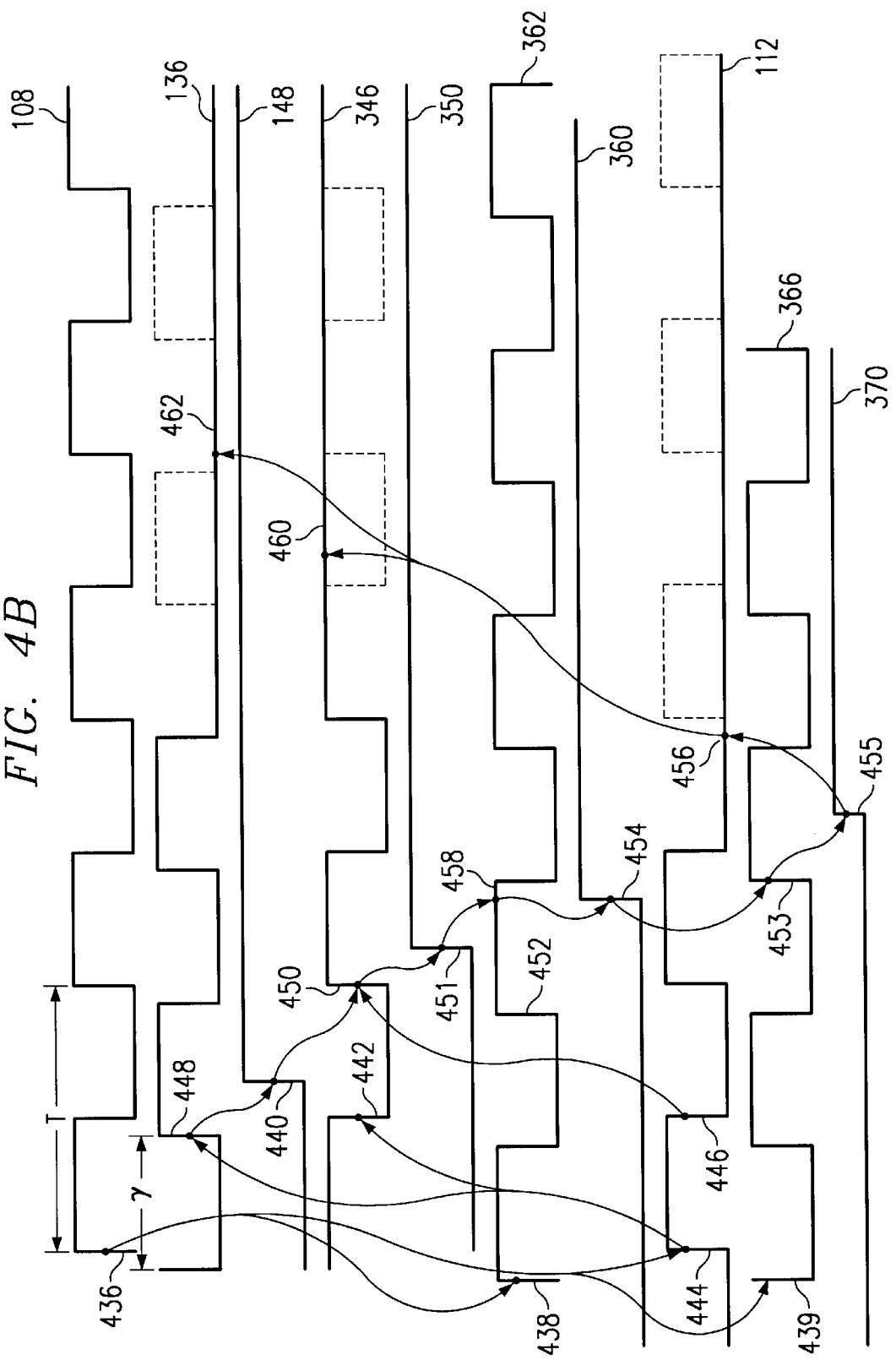

METHOD AND SYSTEM FOR SYNCHRONOUSLY TRANSFERRING DATA BETWEEN CLOCK DOMAINS SOURCED BY THE SAME CLOCK

BACKGROUND OF THE INVENTION

1. Technical Field

The present invention relates to circuit design and operation of circuits. More particularly, the present invention relates to synchronously transferring control signals in a clock distribution flow. Still more particularly, the present invention relates to transferring data between two different clock domains which are both derived from the same clocking source.

2. Description of Related Art

The clock signal for all memory storage elements on an electronic chip are generated centrally on the chip at the phase locked loop (PLL) and distributed to the memory storage elements through a series connection of wires and buffering circuits. These wires and buffering circuits present a delay element in the clock distribution path. The electrical wire delay is due to the natural parasitic inductive, resistive, and capacitive characteristics of the wire. The buffering circuit delay is generated by the devices within the buffering circuit. As the frequency of the chip is increased, the delay between the launch of a clock edge at the PLL and its arrival at the memory storage elements, can exceed the clock signal time period.

In order to stop the clock for either power dissipation control or debug control, a logic gate is introduced into the clock distribution path in series with the clock distribution wires, buffering circuits and PLL so that the clock signal distributed to the memory storage elements can be forced by the logic gate to either a logic '1' or logic '0' state for an indefinite period of time. The memory storage elements receiving the clock signal generate the control signal for this logic gate, which enables the logic gate to start or stop the clock signal.

It is important for the logic control signal, from the memory storage element, to arrive at the logic control gate while the clock signal logic level is at the desired stop or start logic level so as not to produce an improperly formed clock pulse. The arrival time of the logic control signal from the memory storage element is directly controlled by the delay of the clock distribution path. As that path delay varies, so will the logic control signal arrival time vary at the logic gate potentially causing incomplete clock pulses.

For example, FIGS. 1A–1D are exemplary illustrations of a typical clock distribution on a typical electronic chip. Electronic chips may contain logic and memory circuits as well as circuits to support these logic and memory circuits. FIG. 1 may consist of one or more electronic chips containing logic and memory circuits as well as circuits to support these logic and memory circuits. The logic and memory circuits may be interconnected in a manner to provide the expected operation of a processor, adapter, bridge or interface element (not shown). Located on these one or more electronic chips is a support circuit consisting of serially connected buffers and electrical wires which distribute a periodic clock signal from a centrally generated source to the memory circuits distributed throughout the electronic chip shown as circuit 100 in FIG. 1A.

In this example, PLL 102 provides clock signal 104 which is distributed throughout the electronic chip using buffering circuits and control circuits 106, 110, 114, 118, 124, 128, and 132 and interconnecting signals 108, 112, 116, 120, 126, 130, C1 134, and C2 136 to memory storage circuit 144. PLL output signal 104 provides a clock signal input to buffer circuit 106 which may consist of one or more series connected inverter circuits. Buffer circuit 106 may be an inverting or a logically non-inverting circuit. Buffer circuit 106 outputs clock signal 108 which is input to selector circuit 110. Selector circuit 110 may choose either signal 108 or signal 142 to output signal 112. For example, if selector signal 148 is at a logic low level ("0"), then selector circuit 110 outputs signal 112 based on clock signal 108. Otherwise, if selector signal 148 is a logic high level ("1"), then selector circuit 110 outputs signal 112 based on selector signal 142. In this example, selector signal 148 represents a logic low level ("0"). In other words, output signal 112 becomes the logical value of either clock signal 108 or signal 142 depending on the logical value of selector signal 148. If selector signal 148 is a logical low level, then output signal 112 is the logically equivalent to clock signal 108. If selector signal 148 is a logic high level, then output signal 112 is the logical equivalent of signal 142.

Signal 112 is input to buffer circuit 114 which outputs signal 116. Signal 116 is input to buffer circuit 118 and outputs signal 120. Signal 120 is input to buffer circuit 124 which outputs signal 126. Signal 126 is input to buffer circuit 128 which outputs signal 130. Buffer circuits 114, 118, 124 and 128 may be logically inverting or non-inverting circuits. Signal 130 is input to clock regenerator circuit 132 which outputs signals C1 134 and C2 136 to memory storage circuit 144. Memory storage circuit 144 consists of memory circuit 150 and memory circuit 152. Memory circuit 150 provides its stored signal 154 to memory circuit 152. Memory circuit 152 outputs signal 148.

Clock regenerator circuit 132 outputs signal C1 134 to memory circuit 150 and provides signal C2 136 to memory circuit 152. Clock regenerator circuit 132 provides a buffered logical inversion of signal 130 to output C1 134 and provides a buffered logical equivalent of signal 130 to output C2 136. Signal 158 provides input to memory storage circuit 144 which is transmitted to signal 148 through a sequential process controlled by C1 134 and C2 136.

Signal 158 provides input to memory circuit 150. When signal C1 134 is a logical high level ("1"), memory circuit 150 outputs the logical value of signal 158 to stored signal 154, which is transmitted to memory circuit 152. When signal C1 134 changes from a logical high level ("1") to a logical low level ("0"), the logical value of signal 158 is stored in memory circuit 150 and outputs stored signal 154 to memory circuit 152. When C2 136 changes from a logical low level ("0") to a logical high level ("1"), memory circuit 152 outputs signal 154 to signal 148. When C2 136 changes from a logical high level ("1") to a logical low level ("0"), signal 154 is stored in memory circuit 152 and outputs signal 148 based on stored signal 154.

Further detailed description of memory storage circuit 144 and similar memory storage circuits may be found in, for example, E. B. Eichelberger and T. W. Williams, "A Logic Design Structure for LSI Testability", IEEE proceedings of 14th Design Automation Conference, June, 1977, pp. 462–468 and Stephen H. Unger and Chung-Jen Tan, "Clocking Schemes for High-Speed Digital Systems", IEEE Transactions on Computers, Vol C-35, No. 10, October 1986, pp. 180 to 195. Other similar clock distribution examples may be found in, for example, "Circuits, Interconnections, and Packaging for VLSI", by Bakoglu, 1990, and IEEE Journal of Solid-State Circuits, Vol 30, No. 4, April 1995, "A Wide-Bandwidth Low-Voltage PLL for PowerPC™ Microprocessors", by Jose Alvarez, et al, pg. 383, Section VII. In addition, PLL circuits are common in the industry and their functionality on a typical electronic chip for clock signal generation is described in, for example, IEEE Journal of Solid-State Circuits, Vol 27, No. 11, November 1992, "A PLL Clock Generator with 5 to 110 MHz of Lock Range for Microprocessors", by Ian A. Young, et al, pg. 1599.

In the present description of the preferred embodiments, a logical high level may be considered a "1", and a logical low level will be considered a "0". The memory circuit 150 is considered the "master", memory circuit 152 is considered the "slave" and memory storage circuit 144 is considered a master/slave flip-flop.

FIGS. 1B, 1C, and 1D are exemplary waveforms which illustrate the location of the launching and capturing latches when exhibiting typical process delays, slow process delays and fast process delays, respectively, produced by circuit 100. In FIGS. 1B, 1C and 1D, T is the period of the clock signal and τ (tau) is the clock distribution latency.

FIG. 1B represents the waveforms for various signals in circuit 100 of FIG. 1A for typical operating conditions. Waveform 108 represents clock signal 108 and consists of first rising edge 103 and first falling edge 101 and second rising edge 121 and second falling edge 123 and additional rising and falling edges, each occurring periodically with a delay T between each rising edge and an equivalent delay T between each falling edge where T is the clock period. Waveform 136 represents clock signal C2 136 and consists of first rising edge 105 and first falling edge 117 followed by a logic low level 119 instead of the expected periodic clock pulses. Waveform 136 first rising edge 105 occurs τ time units after waveform 108 first rising edge 103 which places the waveform 136 first rising edge 105 occurring after the waveform 108 first falling edge 101 and before waveform 108 second rising edge 121. In FIG. 1B, τ is less than T.

Waveform 148 represents selector signal 148 and consists of first rising edge 111 occurring after waveform 136 first rising edge 105. Waveform 112 represents signal 112 provided by selector 110 and consists of first rising edge 107, first falling edge 109, followed by a logic low level 115 instead of the expected periodic clock pulses. Waveform 112 first rising edge 107 occurs after waveform 108 first rising edge 103, but before waveform 108 first falling edge 101. Waveform 112 first falling edge 109 occurs after waveform 108 first falling edge 101 but before waveform 108 second rising edge 121. Waveform 148 first rising edge 111 occurs after waveform 112 first falling edge 109 but before waveform 112 expected second rising edge and before waveform 108 second rising edge 121.

The process of stopping the clock is initiated by the clock signal 108 rising edge 103 which propagates through selector 110 to form signal 112 rising edge 107 which continues to propagate through clock distribution elements 114, 118, 124, 128, and 132 causing clock C2 136 rising edge 105. In this example, selector signal 148 is a logic low level which causes selector 110 to provide signal 108 to output signal 112. Clock signal C2 136 rising edge 105 causes storage circuit 144 to provide rising edge 111 for selector signal 148. Clock signal 108 first falling edge 101 propagates through selector 110 to form signal 112 falling edge 109 which continues to propagate through clock distribution elements 114, 118, 124, 128, and 132 causing clock C2 136 falling edge 117. Selector signal 148 rising edge 111 occurs after clock signal 108 falling edge 101 but prior to clock signal 108 second rising edge 121 while clock signal 108 is a logic low level. Selector signal 148 logic high signal causes selector 110 to provide logic low level signal 142 to output signal 112 prior to clock signal 108 second rising edge 121. When clock signal 108 second rising edge 121 occurs, selector circuit 110 does not provide clock signal 108 to signal 112 due to the logic high level provided by selector signal 148. Signal 112 remains at a logic low level 115 instead of the expected periodic clock signal 108 second rising and falling edges 121 and 123, respectively. Signal 112 logic low level 115 keeps all clocks signals at a static logic level as represented by clock C2 136 logic low level 119 instead of the expected periodic clock pulse from clock signal 108 second rising and falling edges 121 and 123, respectively.

FIG. 1C represents the waveforms for various signals in the circuit 100 of FIG. 1A for slow operating conditions. As in FIG. 1B, waveform 108 represents clock signal 108 and consists of a first rising edge 125 and a first falling edge 127 and additional rising and falling edges, each occurring periodically with a delay T between each rising edge and an equivalent delay T between each falling edge where T is the clock period. Waveform 136 represents clock signal C2 136 and consists of a first rising edge 129 and a first falling edge, a second rising edge 139, a second falling edge 147 followed by a logic low level 151 instead of the expected periodic clock pulses. Waveform 136 first rising edge 129 occurs τ time units after waveform 108 first rising edge 125 which places the waveform 136 first rising edge 129 occurring after waveform 108 second rising edge and before waveform 108 second falling edge. In FIG. 1C, τ is greater than T.

Waveform 148 represents selector signal 148 and consists of first rising edge 131 occurring after waveform 136 first rising edge 129. Waveform 112 represents signal 112 provided by selector 110 and consists of first rising edge 133, a first falling edge, followed by a second rising edge 141, followed by a second falling edge 143, followed by a logic low level 149 instead of the expected periodic clock pulses. Waveform 112 first rising edge 133 occurs after waveform 108 first rising edge 125, but before waveform 108 second rising edge. Waveform 112 second rising edge 141 occurs after waveform 108 second rising edge but before first waveform second falling edge. Waveform 148 first rising edge 131 occurs after waveform 112 second rising edge 141 but before waveform 112 second falling edge 143 and before waveform 108 second falling edge.

The process of stopping the clock is initiated by clock signal 108 rising edge 125 which propagates through selector 110 to form signal 112 rising edge 133 which continues to propagate through clock distribution elements 114, 118, 124, 128, and 132 causing clock C2 136 rising edge 129. Selector signal 148 is a logic low level which causes selector 110 to provide clock signal 108 to output signal 112. Clock signal C2 136 rising edge 129 causes storage circuit 152 to provide rising edge 131 for selector signal 148. Clock signal 108 first falling edge 127 propagates through selector 110 to form signal 112 waveform 112 first falling edge which continues to propagate through clock distribution elements 114, 118, 124, 128, and 132 causing clock C2 136 waveform 136 first falling edge. Clock signal 108 second rising edge propagates through selector 110 to form signal 112 waveform 112 second rising edge 141 which continues to propagate through clock distribution elements 114, 118, 124, 128, and 132 causing clock C2 136 waveform 136 second rising edge 139. Selector signal 148 rising edge 131 occurs after clock signal 108 waveform 108 second rising edge but prior to clock signal 108 waveform 108 second falling edge while clock signal 108 is a logic high level. Selector signal 148 logic high signal causes selector 110 to provide logic low level signal 142 to output signal 112 forming waveform 112 second falling edge 143 prior to clock signal 108 waveform 108 second falling edge. As a result, the clock pulse on signal 112 waveform 112 second rising edge 141 and second falling edge 143 is smaller than the clock pulse provided by signal 108 waveform 108 second rising edge and second falling edge. Signal 112 waveform 112 second falling edge 143 continues to propagate through clock distribution elements 114, 118, 124, 128, and 132 causing clock C2 136 second waveform second falling edge 147. As a result, the clock pulse on signal 136 waveform 136 second rising edge 139 and second falling edge 147 is smaller than the clock pulse provided by signal 108 waveform 108 second rising edge and second falling edge. When clock signal 108 second falling edge occurs, selector circuit 110 does not provide clock signal 108 to signal 112 due to the logic high level provided by selector signal 148. Signal 112 remains at a logic low level 149 instead of expected periodic clock signal 108 third rising and falling edges. Signal 112 logic low level 149 keeps all clock signals at a static logic level as represented by clock C2 136 logic low level 151 instead of the expected periodic clock pulse from clock signal 108 third rising and falling edges.

FIG. 1D represents the waveforms for various signals in the circuit 100 of FIG. 1A for fast operating conditions. As in FIGS. 1B and 1C, waveform 108 represents clock signal 108 and consists of a first rising edge 153 and a first falling edge and additional rising and falling edges, each occurring periodically with a delay T between each rising edge and an equivalent delay T between each falling edge where T is the clock period. Waveform 136 represents clock signal C2 136 and consists of first rising edge 155 and first falling edge 157, followed by a logic low level 167 instead of the expected periodic clock pulses. Waveform 136 first rising edge 155 occurs τ time units after waveform 108 first rising edge 153 which places waveform 136 first rising edge 155 occurring after waveform 108 first rising edge 153 and before waveform 108 first falling edge. In FIG. 1D, τ is less than T.

Waveform 148 represents selector signal 148 and consists of first rising edge 159 occurring after waveform 136 first rising edge 155. Waveform 112 represents signal 112 provided by selector 110 and consists of first rising edge 161, first falling edge 163, followed by logic low level 165 instead of the expected periodic clock pulses. Waveform 112 first rising edge 161 occurs after waveform 108 first rising edge 153, but before waveform 108 first falling edge. Waveform 148 first rising edge 159 occurs after waveform 112 first rising edge 161 but before waveform 112 first falling edge 163 and before waveform 108 first falling edge.

The process of stopping the clock is initiated by the clock signal 108 rising edge 153 which propagates through selector 110 to form signal 112 rising edge 161 which continues to propagate through clock distribution elements 114, 118, 124, 128, and 132 causing clock C2 136 rising edge 155. Selector signal 148 is a logic low level which causes selector 110 to provide output signal 108 to signal 112. Clock signal C2 136 rising edge 155 causes storage circuit 152 to provide rising edge 159 for selector signal 148. Selector signal 148 rising edge 159 occurs after clock signal 108 waveform 108 first rising edge 153 but prior to clock signal 108 waveform 108 first falling edge while clock signal 108 is a logic high level. Selector signal 148 logic high signal causes selector 110 to provide logic low level signal 142 to output signal 112, forming waveform 112 first falling edge 163 prior to clock signal 108 waveform 108 first falling edge. As a result, the clock pulse on signal 112 waveform 112 first rising edge 161 and first falling edge 163 is smaller than the clock pulse provided by signal 108 first waveform first rising edge 153 and first falling edge. Signal 112 waveform 112 first falling edge 163 continues to propagate through clock distribution elements 114, 118, 124, 128, and 132 causing clock C2 136 waveform 136 first falling edge 157. As a result, the clock pulse on signal 136 waveform 136 first rising edge 155 and first falling edge 157 is smaller than the clock pulse provided by signal 108 waveform 108 first rising edge 153 and first falling edge. When clock signal 108 second rising edge occurs, selector circuit 110 does not provide clock signal 108 to signal 112 due to the logic high level provided by selector signal 148. Signal 112 remains at logic low level 165 instead of the expected periodic clock signal 108 second rising and falling edges. Signal 112 logic low level 165 keeps all clocks signals at a static logic level as represented by clock C2 136 logic low level 167 instead of the expected periodic clock pulse from clock signal 108 second rising and falling edges.

In summary, circuit 100 of FIG. 1A has the following disadvantages as shown in FIGS. 1B, 1C, and 1D. When selector signal 148 in FIG. 1A changes from a logic low level to a logic high level, the clock signal C2 136 in FIG. 1B representing the typical process delays, shown as the waveform 136 in FIG. 1B, has one clock pulse which is equivalent to the clock pulse of signal 108 waveform 108. When selector signal 148 of FIG. 1A changes from a logic low level to a logic high level, the clock signal 136 in FIG. 1C, representing the slow process delays, shown as waveform 136, has one clock pulse which is equivalent to the clock pulse of signal 108 waveform 108, and a second clock pulse formed by waveform 136 rising edge 139 and falling edge 147, smaller than the clock pulse of signal 108 waveform 108. When selector signal 148 of FIG. 1A changes from a logic low level to a logic high level, the clock signal C2 136 in FIG. 1D, representing the fast process delays, shown as waveform 136, has one clock pulse which is smaller than the clock pulse of signal 108 waveform 108. Therefore, circuit 100 of FIG. 1A produces a non-determistic number of clock pulses and ill-formed clock pulses when selector signal 148 of FIG. 1A changes from a logic low level to a logic high level. Hence, it would be advantageous to have an improved method and apparatus for transferring data between two different clock domains which are both derived from the same clocking source.

SUMMARY OF THE INVENTION

The present invention provides a method and system for controlling a clock signal. The clock signal is first stored in a storage device. An input representing a clock control signal is input into a first end of a plurality of interconnected memory storage circuits. An outputted clock signal is output from a second end of the plurality of interconnected memory storage circuits based on receipt of the pulse representing the clock control signal. In one embodiment, the plurality of interconnected memory storage circuits is comprised of latches. In an alternate embodiment, the plurality of interconnected memory storage circuits is comprised of latches and master/slave flip-flops.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 1A–1D are exemplary illustrations of a typical clock distribution on a typical electronic chip in which the present invention may be implemented;

FIGS. 2A and 2B are exemplary illustrations of a multiple latch to latch data transfer between multiple clock domains in which the present invention may be implemented;

FIGS. 4A and 4B are exemplary waveforms which illustrate the location of the rising edge and falling edge of the preferred embodiment in which the present invention may be implemented;

DETAILED DESCRIPTION OF THE PREFERRED EMBODIMENT

Figure 2B:
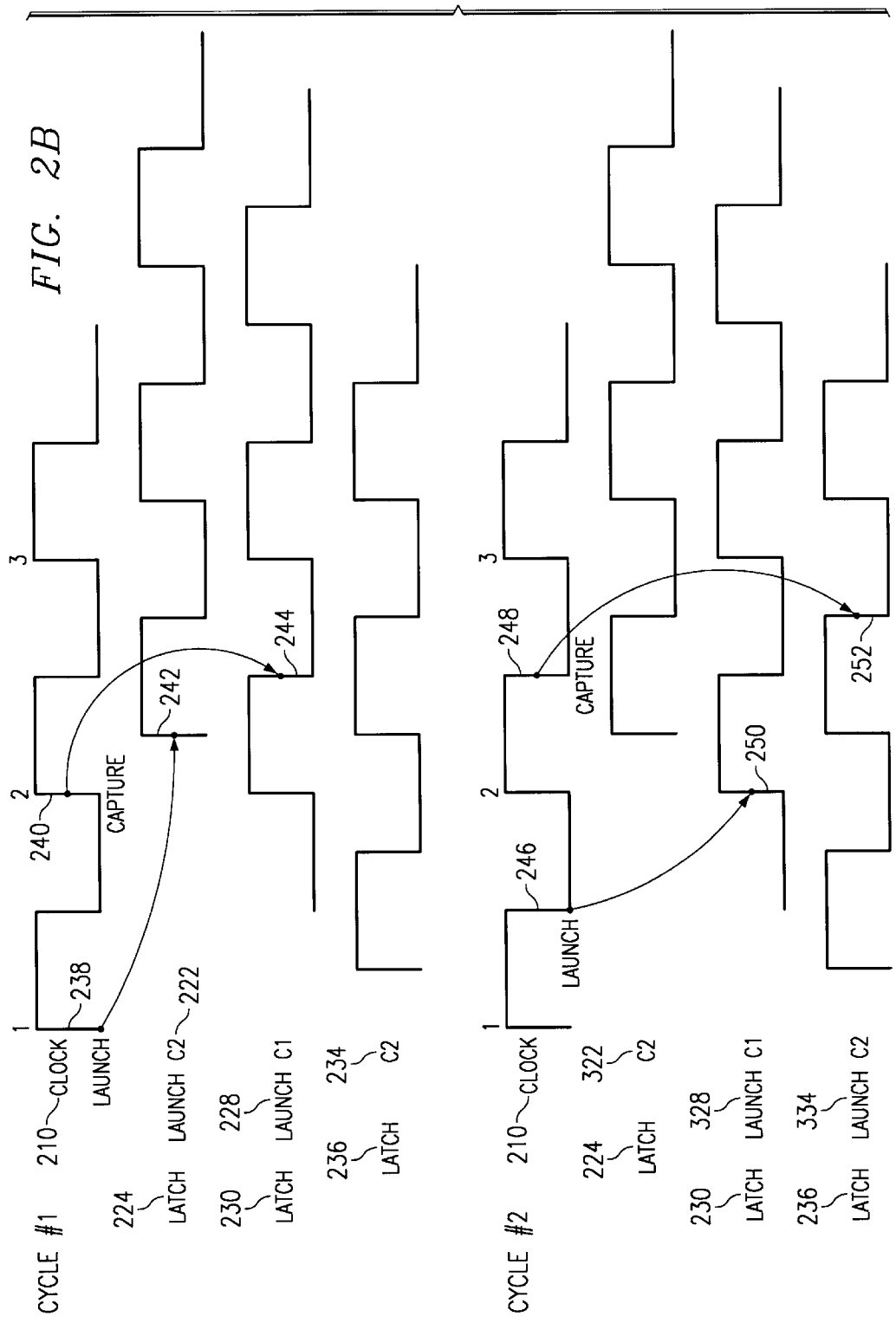

With reference now to the figures, and in particular with reference to FIGS. 2A and 2B which are exemplary illustrations of a multiple latch to latch data transfer between multiple clock domains in which the present invention may be implemented. In this example, the data moves upstream from latch 224 to latch 236 via latch 230. Each of these latches is in a different clock domain. Circuit 200 of FIG. 2A represents the basic configuration of transferring a signal from one clock domain to another earlier clock domain. The three different clock domains in FIG. 2A are represented by clock signals 210, 212 and 214.

Figure 1A:
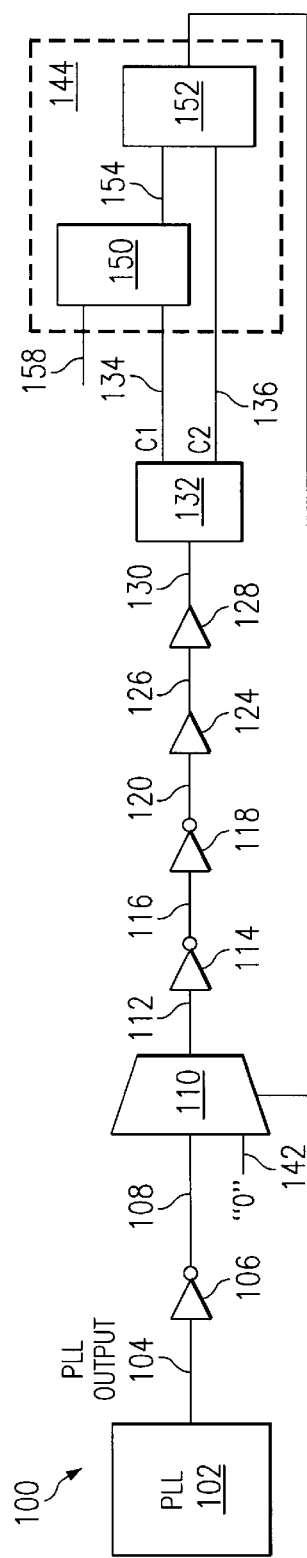
Figure 1B:
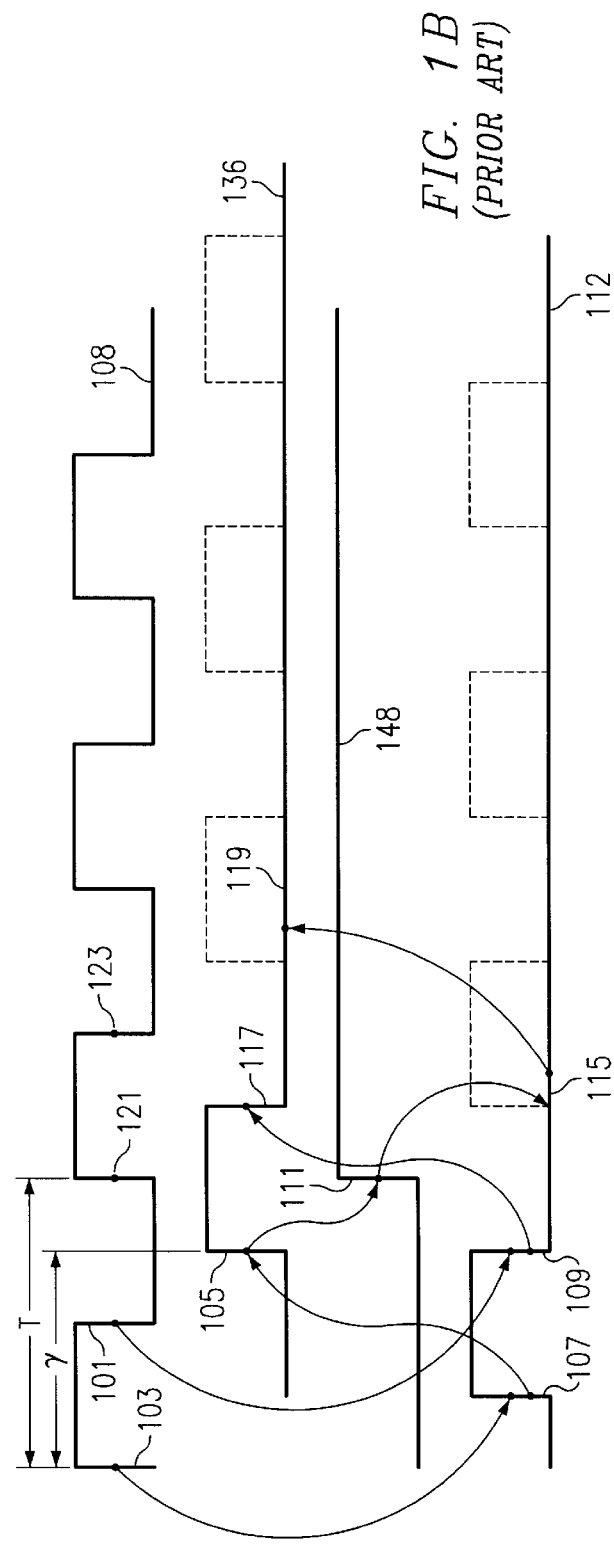
Figure 1C:
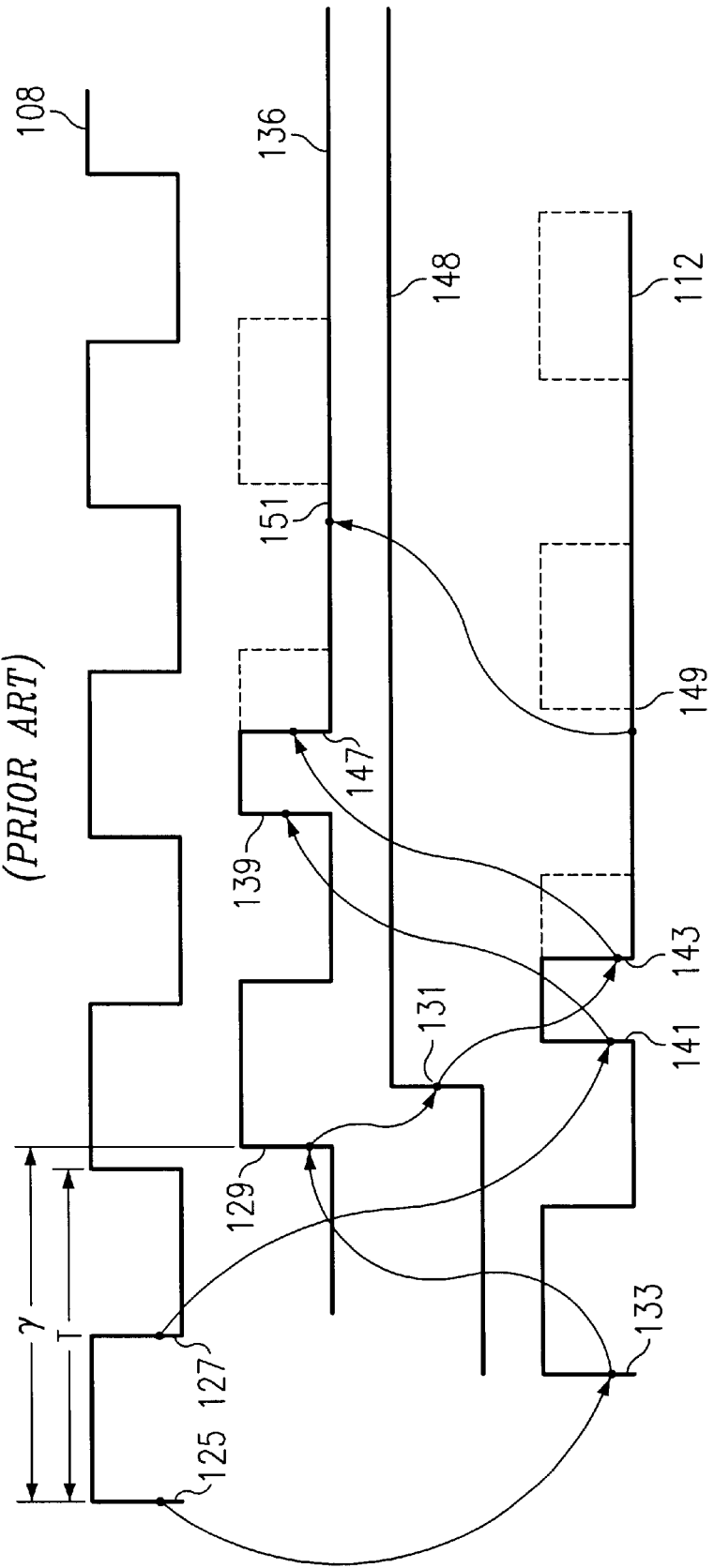
Figures 1D, 2A:
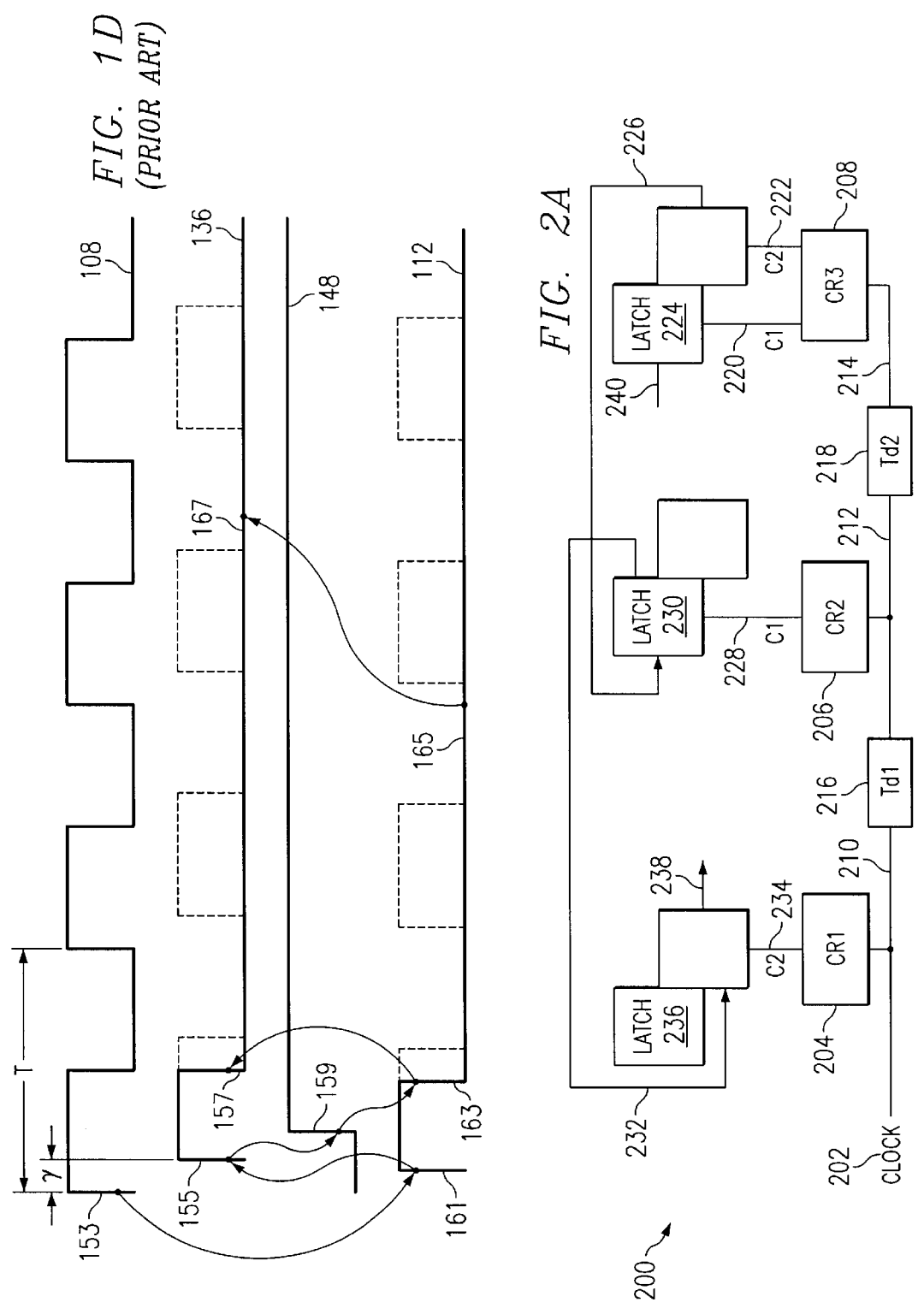

In this example, each of these clock signals 210, 212, and 214 have the same clock period and differ only by their temporal relationship, e.g. signal 212 is a replica of clock signal 210 delayed $T_{d1}$ time units by delay block 216, signal 214 is a replica of clock signal 212 delayed $T_{d2}$ time units by delay block 218. Therefore, clock signal 214 is a replica of clock signal 210 delayed by the sum of $T_{d1}$ and $T_{d2}$ time units by delay blocks 216 and 218. Clock signal 210 is the earliest clock time domain since it is the clock source, clock signal 212 becomes the second clock time domain since it is delayed $T_{d1}$ time units and 214 becomes the last clock domain since it is delayed the sum of $T_{d1}$ and $T_{d2}$ time units. To those skilled in the art, it should be apparent the delay blocks 216 and 218 in FIG. 2A may be replaced by a series connection of buffering circuits and interconnecting wires much like the representative clock distribution elements 114 through 128 of FIG. 1A.

Clock 202 provides clock signal 210 to both clock regenerator circuit 204 and time delay block 216. Output signal 212 from time delay block 216 provides input signal to both clock regenerator circuit 206 and time delay block 218. Time delay block 218 provides output signal 214 to clock regenerator circuit 208. Clock regenerator circuit 208 provides clock signal outputs C1 220 and C2 222 to latch 224 which then outputs output signal 226 to launching latch 230. Launching latch 230 combines the output clock signal C1 228 from clock regenerator circuit 206 with input signal 226 and provides output signal 232 which is then transmitted to capture latch 236. Capture latch 236 then takes clock signal C2 234 from clock regenerator circuit 204 and combines this with input signal 232 from launching latch 230 to store signal 232 within capture latch 236. Elements 114 through 128 in FIG. 1A may represent a delay block, such as delay blocks 216 and 218, due to the delay of the buffering circuits 114, 118, 124, and 128, in addition to the wire interconnect delay of wire interconnects 116, 120, and 126.

The "setup and "hold" equations for the transfer of data from latch 224 to latch 230 in circuit 200 may be written as:

$$T_{d2} < (T_{cr2} - T_{cr3}) - U - D_{cq} + T \quad \text{Setup}$$

$$T_{d2} > (T_{cr2} - T_{cr3}) + H - D_{cq} + T_{sk2\text{-}3} \quad \text{Hold}$$

where:

$T_{d2}$ is the propagation delay of time delay block 218;
$T_{cr2}$ is the propagation delay of clock regenerator circuit 206 from signal 212 to output clock signal C1 228;
$T_{cr3}$ is the propagation delay of clock regenerator circuit 208 from signal 214 to output clock signals C1 220 and C2 222;
U is the setup time for capture latch 230;
$D_{cq}$ is the latch propagation delay from the rising edge of clock signal C2 222 to output signal 226 of launching latch 224;
T is the clock period of clock signal 202;
H is the hold time for capture latch 230; and
$T_{sk2\text{-}3}$ is the estimated clock skew from latch 224 to latch 230.

For the transfer of data from latch 224 to latch 236, two cases may be considered. The first case is when data arrives at latch 230 prior to the rising edge of signal C1 228 at latch 230. In the second case, data arrives at latch 230 after the rising edge of signal C1 228 at latch 230.

The "setup" and "hold" equations for the transfer of data from latch 224 to latch 236 in circuit 200 may be written as follows:

$$T_{d1} < (T_{cr1} - T_{cr2}) - U - D_{cq2} + T \quad \text{(Setup case 1)}$$

$$T_{d1} + T_{d2} < 3(T/2) - U - D_{cq3} - D_{dq} + (T_{cr1} + T_{cr3}) \quad \text{(Setup case 2)}$$

$$T_{d1} > (T_{cr1} - T_{cr2}) + H - D_{cq2} + T_{sk1\text{-}2} \quad \text{Hold}$$

where:

$T_{d1}$ is the propagation delay of time delay block 216;
$T_{d2}$ is the propagation delay of time delay block 218;
$T_{cr1}$ is the propagation delay of clock regenerator circuit 204 from input clock signal 210 to output clock signal C2 234;
$T_{cr2}$ is the propagation delay of clock regenerator circuit 206 from input clock signal 212 to output clock signal C1 228;
$T_{cr3}$ is the propagation delay of clock regenerator circuit 208 from input clock signal 214 to output clock signals C1 220 and C2 222;
U is the setup time for capture latch 236;
$D_{cq2}$ is the latch propagation delay from the rising edge of clock signal C1 228 to the output signal 232 of launching latch 230;
$D_{cq3}$ is the latch propagation delay from the rising edge of clock signal C2 222 to the output signal 226 of launching latch 224;
$D_{dq}$ is the latch propagation delay from input signal 226 to output signal 232 of latch 230;
T is the clock period of clock signal 202;
H is the hold time for capture latch 236; and
$T_{sk1\text{-}2}$ is the clock skew between latch 230 and latch 236.

In this example, circuit 200 transfers the signal contained in latch 224 to latch 236 through two cycles shown in FIG. 2B. Cycle #1 represents the clock waveforms for clock signals 210, C2 222, C1 228, and C2 234, respectively, for transfer of data stored in latch 224 to latch 230. Cycle #2 represents the clock waveforms for clock signals 210, C2 222, C1 228, and C2 234, respectively, for transfer of data stored in latch 230 to latch 236.

The timing relationship between the rising and falling edges of cycle #1 and cycle #2 may be described in the following manner. First rising edge 238 of clock signal 210 propagates through delay block 216, delay block 218, and clock regenerator circuit 208, resulting in clock signal C2 222 to form the first rising edge 242. First falling edge 246 of clock signal 210 propagates through delay block 216 and clock regenerator circuit 206 resulting in clock signal C1 228 to form rising edge 250. Second rising edge 240 of clock signal 210 propagates through delay block 216 and clock regenerator circuit 206 resulting in clock signal C1 228 to form falling edge 244. Second falling edge 248 of clock signal 210 propagates through clock regenerator circuit 204 resulting in clock signal C2 234 to form falling edge 252. The time difference between rising edge 238 and rising edge 240 represents clock signal 210 clock period. Likewise, the time difference between falling edge 246 and falling edge 248 also represents clock signal 210 clock period.

In cycle #1, clock signal 210 initiates the transfer of a signal stored in latch 224 to latch 230 through first rising edge 238 which, as previously described, propagates to clock signal C2 222 as rising edge 242 causing the signal stored in latch 224 to be outputted to signal 226. Signal 226 propagates to latch 230. Signal 226 is stored in latch 230 when clock signal 210 second rising edge 240 which, as previously described, propagates to clock C1 228 falling edge 244 storing signal 226 in latch 230. The time difference between rising edge 242 and falling edge 244 follow the equations previously described as "setup" and "hold" equations for the transfer of data from latch 224 to latch 230 in circuit 200. The arrival time of signal 226 at latch 230 follow the equations previously described as "setup" and "hold" equations for the transfer of data from latch 224 to latch 230 in circuit 200. In cycle #2, clock signal 210 initiates and/or controls the transfer of signal 226 through latch 230 to signal 232 to latch 236. Clock signal 210 first falling edge 246 which, as previously described, propagates to clock signal C1 228 as rising edge 250.

There are two cases which may be considered for transferring signal 226 through latch 230 to signal 232 which is stored in latch 236. In the first case, signal 226, from latch 224, arrives at latch 230 prior to rising edge 250. Rising edge 250 allows signal 226 to propagate through latch 230 to signal 232 to latch 236. Signal 232 is stored in latch 236 when clock signal 210 second falling edge 248 which, as previously described, propagates to clock signal C2 234 as falling edge 252. The time difference between rising edge 250 and falling edge 252 follow the equations previously described as the "setup" and "hold" equations for the transfer of data from latch 224 to latch 236 in circuit 200. The arrival time of signal 232 at latch 236 follow the equations previously described as the "setup" and "hold" equations for the transfer of data from latch 224 to latch 236 in circuit 200 (Setup case 1).

In the second case, signal 226, from latch 224, arrives at latch 230 after clock C1 228 rising edge 250 but prior to clock C1 228 falling edge 244. Since clock C1 228 is at a logic high level when signal 226 arrives, signal 226 propagates through latch 230 to signal 232 and arrives at latch 236 prior to clock C2 234 falling edge 252. Since clock C1 228 does not inhibit the propagation of signal 226 through latch 230 to signal 232, the signal stored in latch 224 may be transferred to latch 236 when the arrival time of signal 232 at latch 236 meet the equations previously described as the "setup" and "hold" equations for the transfer of data from latch 224 to latch 236 in circuit 200 (Setup case 2).

The present invention synchronously and deterministically transfers a control signal generated by clock stopping logic circuitry in the GCLK clocking domain to logic clocked by the output of the PLL circuit. The logic clocked by the PLL circuit will start and stop the clocks on a digital electronic chip. The present invention controls the electronic chip clock starting and stopping at the output of the phase locked loop (PLL) by logic generating control signals in the GCLK domain, where the GCLK (or global clock signal) will represent the clock signal distributed through a plurality of memory storage circuits throughout the digital electronic logic circuits. In one embodiment, the memory storage circuits may comprise a plurality of latches. In an alternate embodiment, the memory storage circuits may comprise a combination of master/slave flip-flops and latches.

Figure 3:
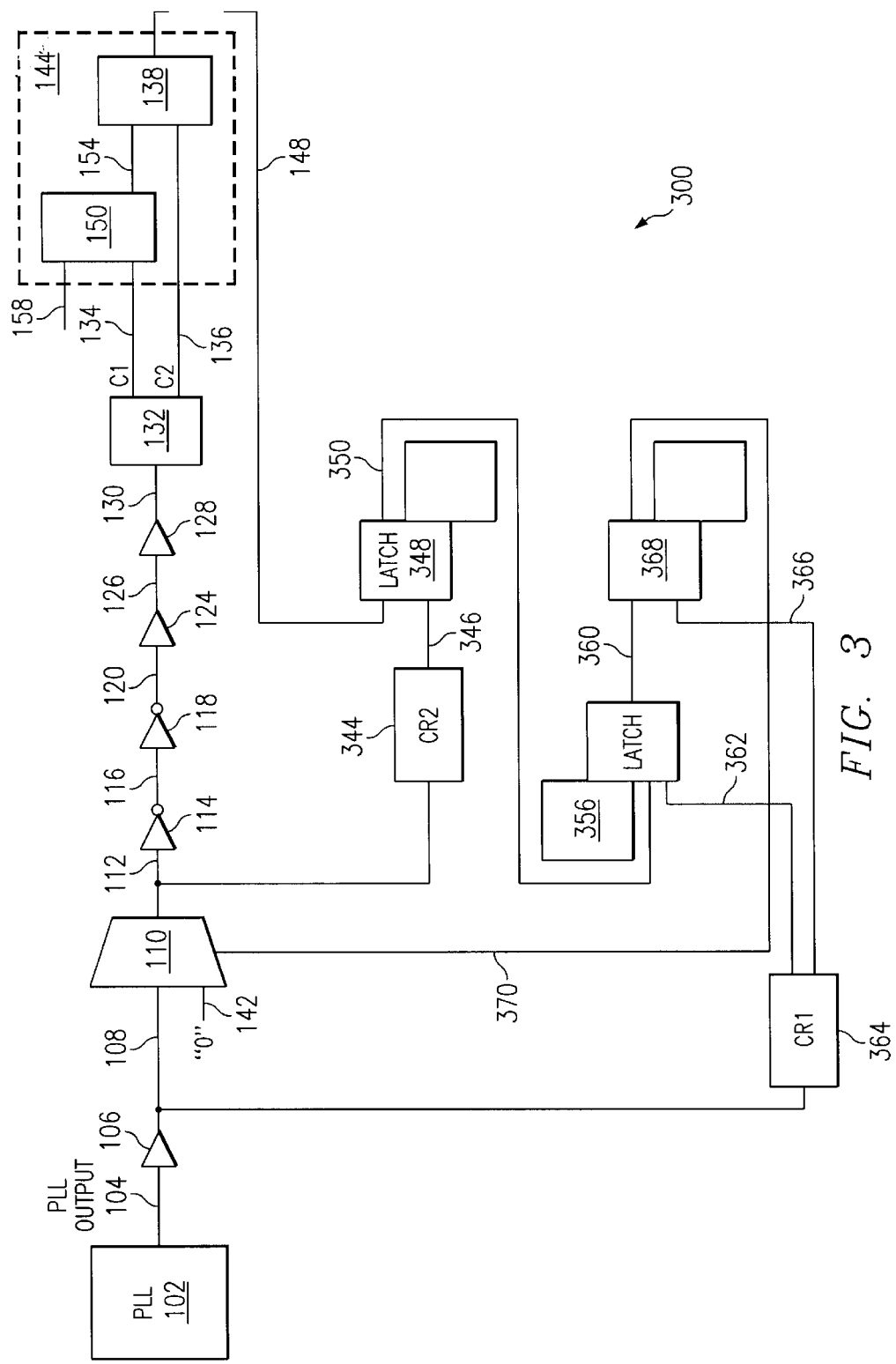
FIG. 3 is an exemplary illustration of the preferred embodiment of the present invention in which the present invention may be implemented for stopping the clock signal.

FIG. 3 is an exemplary illustration of the preferred embodiment of the present invention in which the present invention may be implemented for stopping the clock signal. Included in circuit 300 is PLL 102 providing clock signal 104 which is distributed throughout the electronic chip using buffering circuits and control circuits 106, 110, 114, 118, 124, 128, and 132 and interconnecting signals 104, 108, 112, 116, 120, 126, 130, C1 134 and C2 136 to memory storage circuit 144. Signal 154 provides input to memory storage circuit 138 through a sequential process controlled by C1 134 and C2 136. In turn, memory storage circuit 144 outputs output signal 148. Input signal 158 is also input into memory storage circuit 144. In addition, circuit 300 includes clock regenerator circuits 364 and 344 and latches 348, 356 and 368.

Output signal 148 provides input for latch 348 which provides output signal 350. Clock regenerator circuit 344 provides a buffered logical inversion of signal 112 and outputs signal C1 346 which provides input to latch 348. When clock signal C1 346 is a logical high level, latch 348 outputs signal 350 based on signal 148. When clock C1 346 transitions from a logical high level to a logical low level, signal 148 is stored within latch 348. When clock C1 346 is a logical low level, latch 348 outputs signal 350 based on the stored value of signal 148. Output signal 350 provides input for latch 356 which provides output signal 360. Clock regenerator circuit 364 provides clock signal C2 362 based on buffered signal 108 which also provides input to latch 356. Clock regenerator circuit 364 also provides clock signal C1 366 based on a logical inverted buffered signal 108 which provides input to latch 368. When clock signal C2 362 is a logical high level, latch 356 provides input signal 360 based on output signal 350. When clock C2 362 transitions from a logical high level to a logical low level, signal 350 is stored within latch 356. When clock C2 1362 is a logical low level, latch 356 provides output signal 360 based on the stored value of signal 350. When clock signal C1 366 is a logical high level, storage circuit 368 provides selector signal 370 based on input signal 360. When clock C1 366 transitions from a logical high level to a logical low level, signal 360 is stored within latch 368. When clock C1 366 is a logical low level, latch 368 provides selector signal 370 based on the stored value of signal 360. Selector signal 370 provides input for selector signal 110.

In this example, delay Td2 218 in FIG. 2A corresponds to the clock signal propagation delay through 114, 116, 118, 120, 124, 126, and 128. In addition, delay Td1 216 in FIG. 2A corresponds to the clock signal propagation delay through 108 and 110. The setup and hold equations previous presented for proper circuit operation of circuit 200 are applicable to circuit 300 of FIG. 3.

Figure 4A:
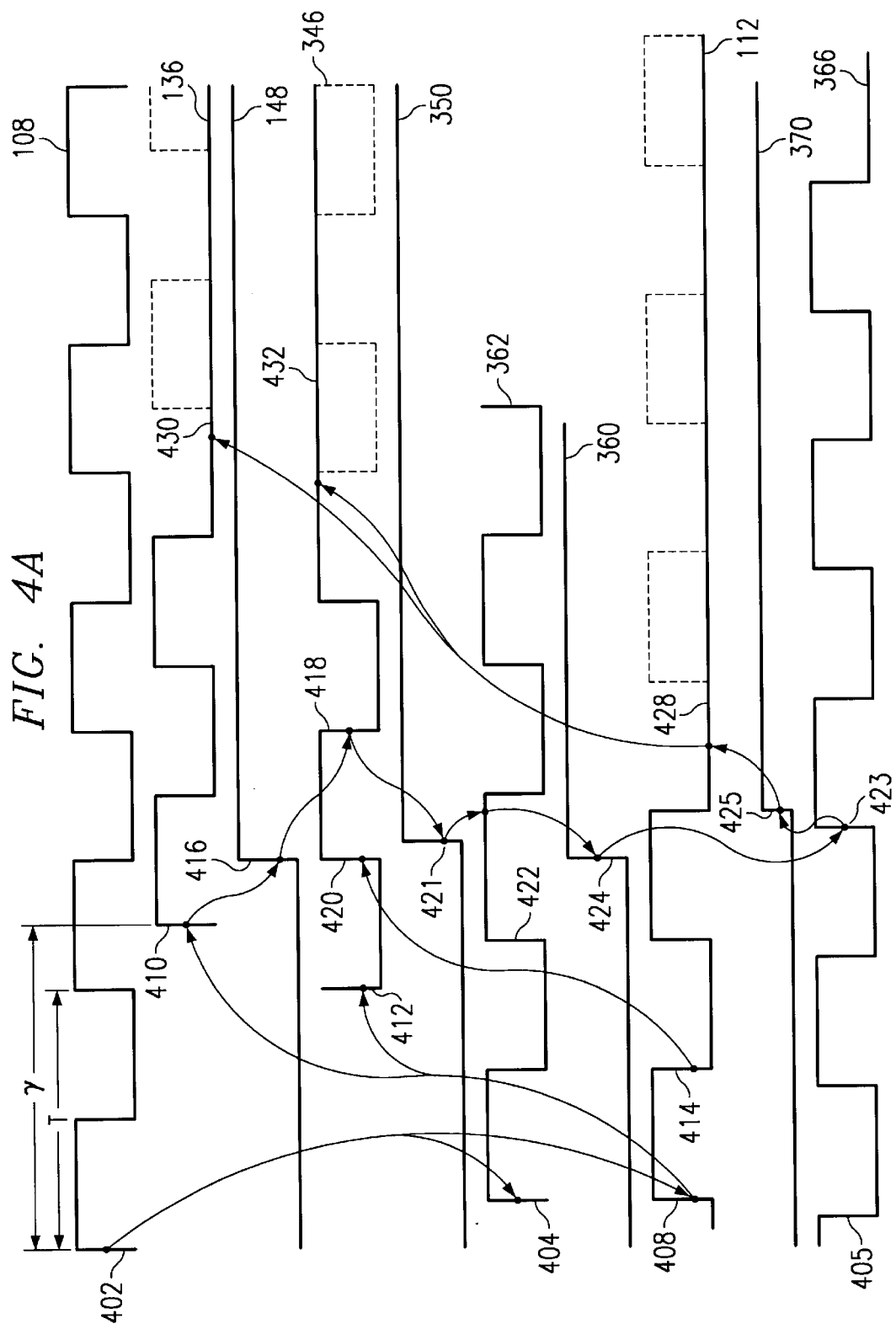

FIGS. 4A and 4B are exemplary waveforms which illustrate the location of the rising edge and falling edge of the preferred embodiment in which the present invention may be implemented. In FIGS. 4A and 4B, reference is made to the clock distribution circuit components and elements in FIG. 3. FIG. 4A represents the waveforms for various signals in circuit 300 of FIG. 3 for typical operating conditions. Waveform 108 represents clock signal 108 and consists of a first rising edge 402, a first falling edge, and additional rising and falling edges, each occurring periodically with a delay T between each rising edge and an equivalent delay T between each falling edge where T is the clock period. Waveform 136 first rising edge 410 occurs τ time units after waveform 108 first rising edge 402 which places waveform 136 first rising edge 410 occurring after waveform 108 second rising edge and before waveform 108 second falling edge. In FIG. 4A, τ is greater than T.

The process of stopping the clock is initiated by clock signal 108 waveform 108 first rising edge 402 which propagates through selector 110 to form signal 112 waveform 112 first rising edge 408 which continues to propagate through clock distribution elements 114, 118, 124, 128, and 132 causing clock C2 136 waveform 136 first rising edge 410 and clock C1 134 first falling edge. Clock signal 108 waveform 108 first rising edge 402 also propagates through clock regenerator circuit 364 to form clock signal C2 362 waveform 362 first rising edge 404. At this time, selector signal 370 is a logic low level which causes selector 110 to provide signal 108 to output signal 112. Clock signal 112 rising edge 408 propagates through clock regenerator circuit 344 to form clock signal C1 346 waveform 346 first falling edge 412. Clock signal 112 first falling edge 414 also propagates through clock regenerator circuit 344 to form clock signal 346 waveform 346 first rising edge 420.

Clock signal C1 134 first falling edge stores signal 158 logic high level in storage circuit 150 and provides stored signal 158 to storage circuit 138 via connection 154. Clock signal C2 136 rising edge 410 causes storage circuit 144 to output signal 148 based on stored signal 154 logic high level forming waveform 148 first rising edge 416.

If output signal 148 waveform 148 first rising edge 416 occurs prior to clock signal C1 346 waveform 346 first rising edge 420, then clock signal C1 346 waveform 346 first rising edge 420 will cause latch 348 to provide signal 350 waveform 350 first rising edge 421. If output signal 148 first rising edge 416 occurs after clock signal C1 346 waveform 346 first rising edge 420, then latch 348 will provide signal 350 waveform 350 first rising edge 421 after rising edge 416 occurs at latch 348 input. Clock C1 346 waveform 346 second falling edge 418 stores output signal 148 in latch 348 and provides the stored signal 148 to output signal 350.

Signal 350 first rising edge 421 is presented to latch 356. If output signal 350 waveform 350 first rising edge 421 occurs prior to clock signal C2 362 waveform 362 second rising edge 422, then clock signal C2 362 waveform 362 second rising edge 422 will cause latch 356 to provide signal 360 waveform 360 first rising edge 424. If output signal 350 waveform 350 first rising edge 421 occurs after clock signal C2 362 waveform 362 second rising edge 422, then latch 356 will provide signal 360 waveform 360 first rising edge 424 after rising edge 421 occurs.

Clock signal 108 waveform 108 second falling edge also propagates through clock regenerator circuit 364 to form clock signal C1 366 waveform 366 second rising edge 423 and clock signal C2 362 waveform second falling edge. Since clock signals C1 366 and C2 362 are logical inversions of each other, signal 360 waveform 360 first rising edge 424 will occur prior to clock signal C1 366 rising edge 423, while clock signal C1 366 is a logical low level. Clock signal C1 366 rising edge 423 will cause latch 368 to provide selector signal 370 with signal 360 logical high level forming waveform 370 first rising edge 425. Rising edge 425 occurs after clock signal 108 waveform 108 second falling edge and prior to its third rising edge. Selector signal 370 logical high level after rising edge 425 causes selector circuit 110 to provide logic low level signal 142 to signal 112.

Therefore, when clock signal 108 third rising edge occurs, selector circuit 110 does not provide clock signal 108 to signal 112 due to the logic high level provided by selector signal 370. Signal 112 remains at a logic low level 428 instead of the expected periodic clock signal 108 third rising and falling edges and subsequent rising and falling edges. Signal 112 logic low level 428 keeps all clock signals at a static logic level as represented by clock C2 136 logic low level 430, clock C1 346 logic high level 432 instead of the expected periodic clock pulse from clock signal 108 third rising and falling edges and subsequent rising and falling edges.

FIG. 4B represents the waveforms for various signals in circuit 300 of FIG. 3 for fast operating conditions. Waveform 108 represents clock signal 108 and consists of a first rising edge 436, a first falling edge, and additional rising and falling edges, each occurring periodically with a delay T between each rising edge and an equivalent delay T between each falling edge where T is the clock period. Waveform 136 first rising edge 448 occurs τ time units after waveform 108 first rising edge 436 which places waveform 136 first rising edge 448 occurring after waveform 108 first rising edge 436 and before waveform 108 second rising edge. In FIG. 4B, τ is less than T.

The process of stopping the clock is initiated by the clock signal 108 waveform 108 first rising edge 436 which propagates through selector 110 to form signal 112 waveform 112 first rising edge 444 which continues to propagate through clock distribution elements 114, 118, 124, 128, and 132 causing clock C2 136 waveform 136 first rising edge 448 and clock C1 134 first falling edge. Selector signal 370 is a logic low level which causes selector 110 to provide signal 108 to output signal 112. Clock signal 108 waveform 108 first rising edge 436 also propagates through clock regenerator circuit 364 to form clock signal C1 366 waveform 366 first falling edge 439 and clock signal C2 362 waveform 362 first rising edge 438. Clock signal C2 136 rising edge 448 causes storage circuit 144 to output signal 148 based on stored signal 154 logic high level forming waveform 148 first rising edge 440.

If output signal 148 waveform 148 first rising edge 440 occurs prior to clock signal C1 346 waveform 346 first rising edge 450, then clock signal C1 346 waveform 346 first rising edge 450 will cause latch 348 to provide signal 350 waveform 350 first rising edge 451. If output signal 148 rising edge 440 occurs after clock signal C1 346 waveform 346 first rising edge 450, then latch 348 will provide signal 350 waveform 350 first rising edge 451 after rising edge 440 occurs at latch 348 input. Clock C1 346 waveform 346 second falling edge stores output signal 148 in latch 348 and outputs signal 350 based on stored signal 148.

Signal 350 first rising edge 451 is presented to latch 356. If output signal 350 waveform 350 first rising edge 451 occurs prior to clock signal C2 362 waveform 362 second rising edge 452, then clock signal C2 362 waveform 362 second rising edge 452 will cause latch 356 to provide signal 360 waveform 360 first rising edge 454. If output signal 350 waveform 350 first rising edge 451 occurs after clock signal C2 362 waveform 362 second rising edge 452, then latch 356 will provide signal 360 waveform 360 first rising edge 454 after rising edge 451 occurs. Clock signal 108 waveform 108 second falling edge also propagates through clock regenerator circuit 364 to form clock signal C1 366 waveform 366 second rising edge 453 and clock signal C2 362 waveform 362 second falling edge.

Since clock signals C1 366 and C2 362 are logical inversions of each other, signal 360 waveform 360 first rising edge 454 will occur prior to clock signal C1 366 rising edge 453, while clock signal C1 366 is a logical low level. Clock signal C1 366 rising edge 453 will cause latch 368 to provide selector signal 370 with signal 360 logical high level forming waveform 370 first rising edge 455. Rising edge 455 occurs after clock signal 108 waveform 108 second falling edge and prior to its third rising edge. Selector signal 370 logical high level after rising edge 455 causes selector circuit 110 to provide logic low level signal 142 to signal 112. When clock signal 108 third rising edge occurs, selector circuit 110 does not provide clock signal 108 to signal 112 due to the logic high level provided by selector signal 370. Signal 112 remains at a logic low level 456 instead of the expected periodic clock signal 108 third rising and falling edges and subsequent rising and falling edges. Signal 112 logic low level 456 keeps all clock signals at a static logic level as represented by clock C2 136 logic low level 462, clock C1 346 logic high level 460 instead of the expected periodic clock pulse from clock signal 108 third rising and falling edges and subsequent rising and falling edges.

Referring to circuit 300 in FIG. 3, and the operation previously described for circuit 300, when power is initially applied to circuit 300, the logical state of memory storage circuits 144, 348, 356 and 368 may be unknown. Therefore, it may be necessary to include, in the circuit path interconnecting memory storage circuit elements 144, 348, 356 and 368 and selector circuit 110, additional logic gates which allow clock signal 108 to propagate through clock distribution circuit 100 to memory storage circuits 144, 348, 356, and 368 until initial operating conditions are established within memory storage circuits 144, 348, 356, and 368, thereby allowing circuit 300 to function as previously described above.

Referring to circuit 300 in FIG. 3, and the operation previously described for circuit 300, selector signal 370 may provide other functions than just controlling clock signal 108 through selector circuit 110 as previously described above. For example, PLL 102 output signal 104 may provide a clock signal to additional logic circuits (not shown). These additional logic circuits may require data supplied by one or more memory storage circuits, such as, for example, memory storage circuit 144 in FIG. 3, which also may be conveyed in a synchronous and deterministic manner to these additional logic circuits using the present invention. The present invention provides a means to convey information stored, for example, in memory storage circuit 144, to the additional logic circuits in a synchronous and deterministic manner through one or more memory storage circuits clocked by clock signals supplied from random points along a clock distribution circuit.

Figure 5:
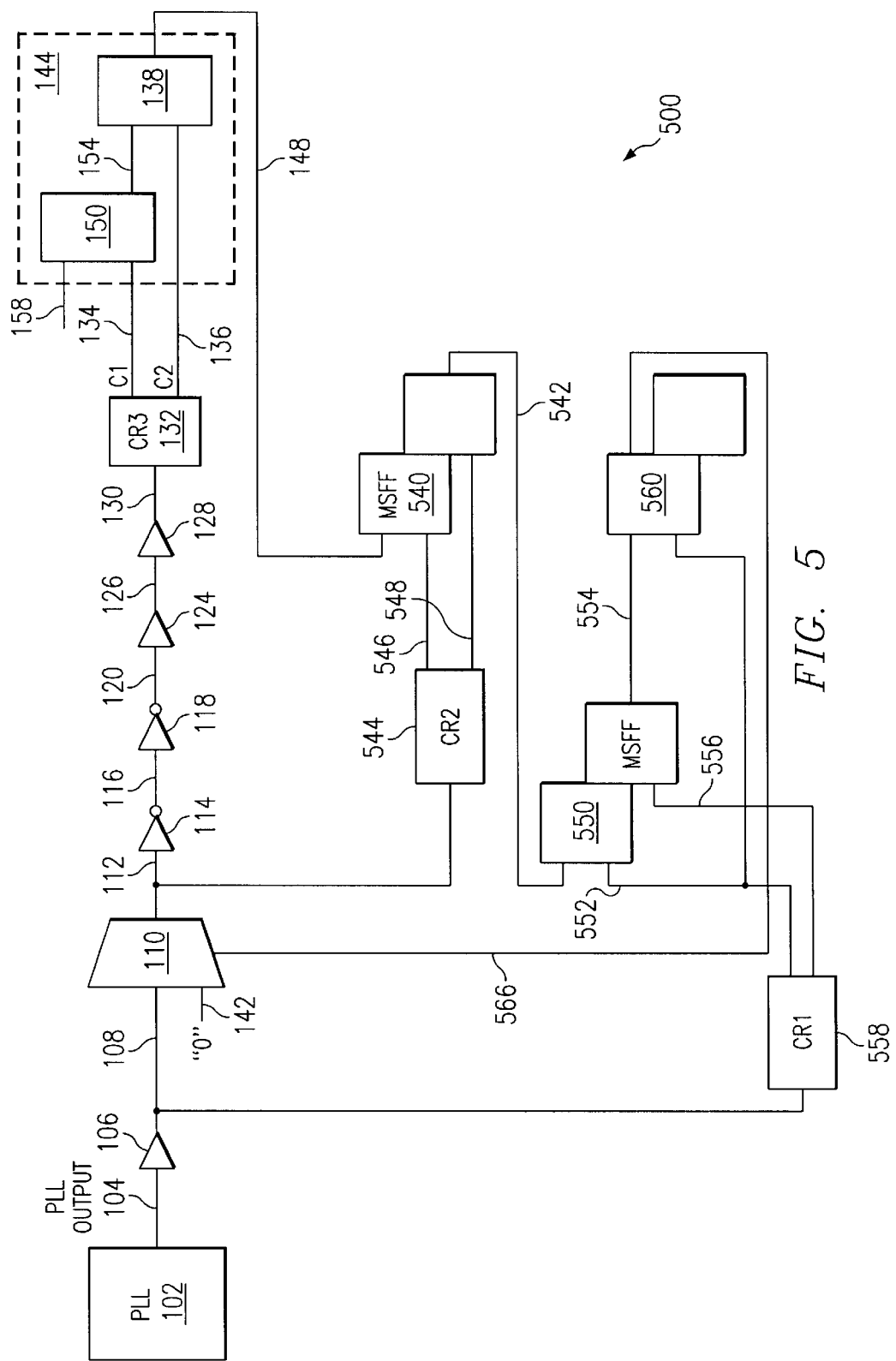
FIG. 5 is an exemplary illustration of an alternate embodiment of the present invention in which the present invention may be implemented.

FIG. 5 is an exemplary illustration of an alternate embodiment of the present invention in which the present invention may be implemented. Included in circuit 500 is PLL 102 providing clock signal 104 which is distributed throughout the electronic chip using buffering circuits and control circuits 106, 110, 114, 118, 124, 128, and 132 and interconnecting signals 104, 108, 112, 116, 120, 126, 130, C1 134 and C2 136 to memory storage circuit 144. Signal 158 provides input to memory storage circuit 144 through a sequential process controlled by C1 134 and C2 136. In turn, memory storage circuit 144 outputs output signal 148. Input signal is also input into memory storage circuit 144.

In addition, circuit 500 includes clock regenerator circuits 558 and 544, master/slave flip-flops 540, 550 and latch 560. Clock regenerator circuit 544 provides a buffered logical inversion of signal 112 to clock signal C1 546 and a buffered signal 112 to clock signal C2 548. Clock signals C1 546 and C2 548 provide input to latch 540. Signal 148 provides input signal to memory storage circuit 540 which is stored within storage circuit 540 through a sequential process controlled by clock C1 546 and C2 548. Memory storage circuit 540 provides output signal 542. Clock regenerator circuit 558 provides a buffered logical inversion of signal 108 to clock signal C1 552 and a buffered signal 108 to clock signal C2 556.

Clock signals C1 552 and C2 556 provide input to latch 550. Clock signal C1 552 also provides input to latch 560. Signal 542 provides input signal to memory storage circuit 550 which is stored within storage circuit 550 through a sequential process controlled by clock C1 552 and C2 556. Memory storage circuit 550 provides output signal 554 which provides input to latch 560. When clock signal C1 552 is a logical high level, latch 560 provides selector signal 566 with signal 554. When clock C1 552 transitions from a logical high level to a logical low level, signal 554 is stored within latch 560. When clock C1 552 is a logical low level, latch 560 provides selector signal 566 with the stored value of signal 554. Selector signal 566 provides input for selector circuit 110.

In this example, delay $T_{d1}$ 216 in FIG. 2A corresponds to the clock signal propagation delay through 110. The setup and hold equations previous presented for proper circuit operation of circuit 200 in FIG. 2A are applicable to circuit 500 of FIG. 5.

Figure 6A:
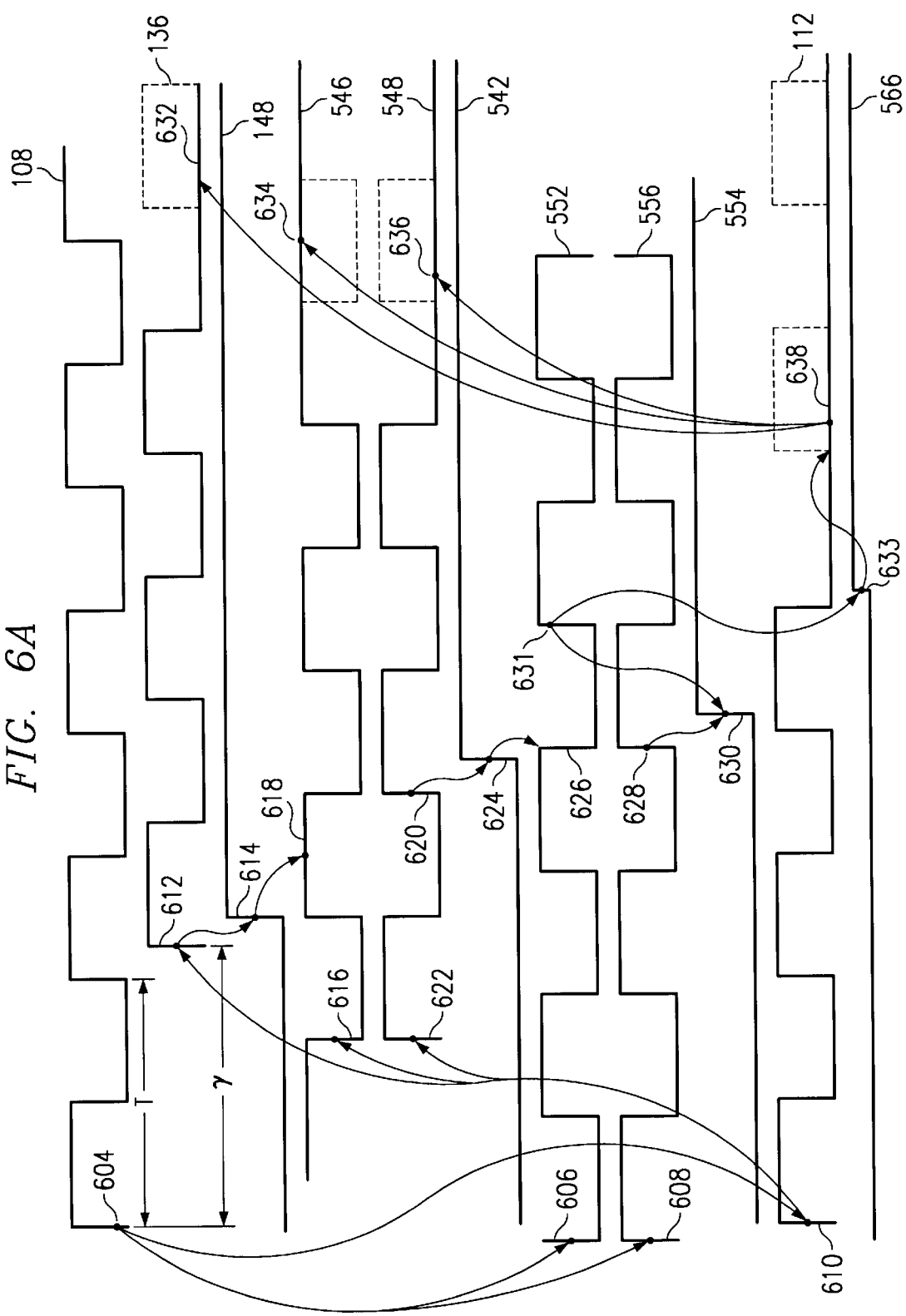
FIGS. 6A and 6B are exemplary waveforms which illustrates the location of the rising edge and falling edge of the alternate embodiment in which the present invention may be implemented.
Figure 6B:
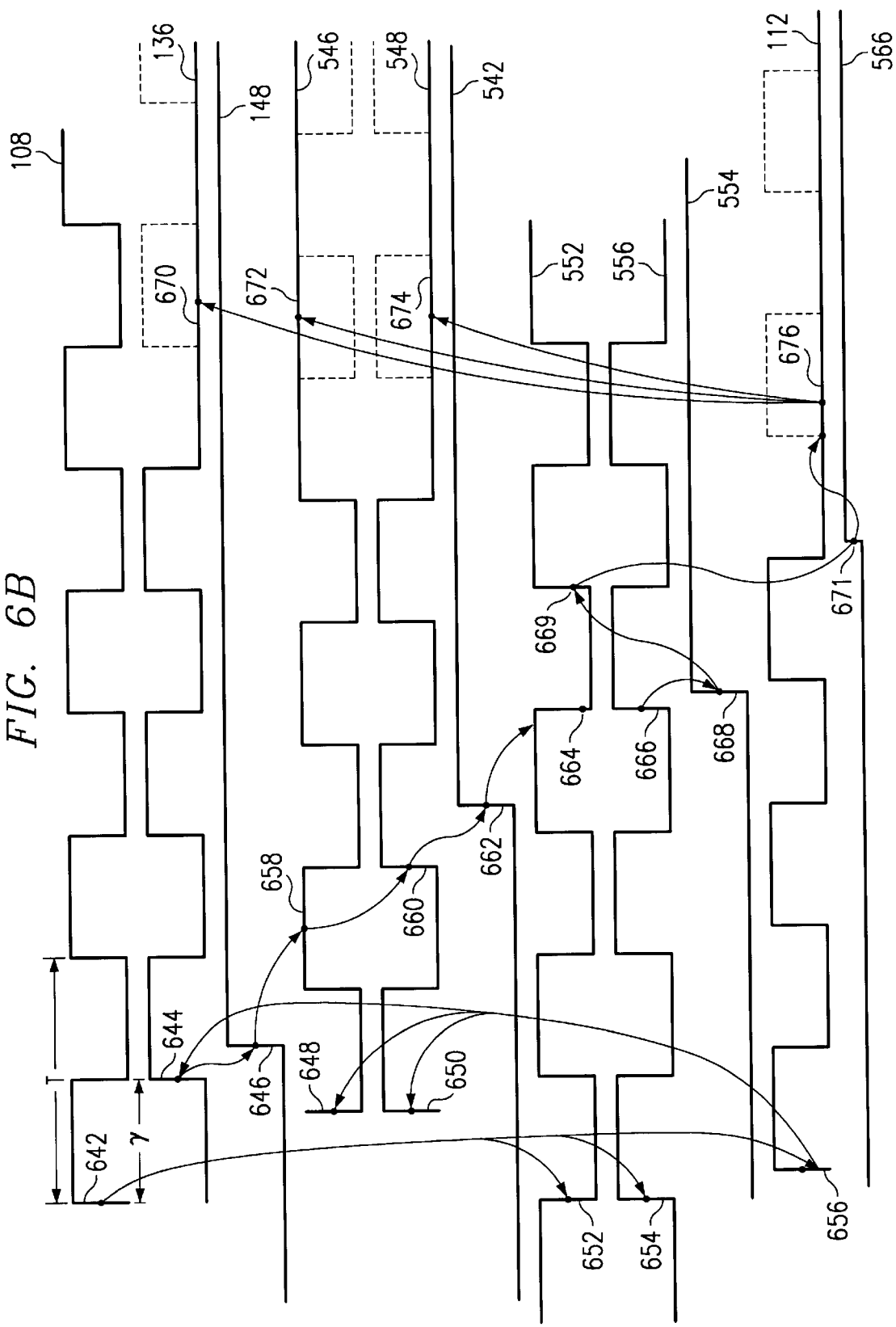

FIGS. 6A and 6B are exemplary waveforms which illustrate the location of the rising edge and falling edge of the alternate embodiment in which the present invention may be implemented. In FIGS. 6A and 6B, reference is made to the clock distribution components and elements in FIG. 5. FIG. 6A represents the waveforms for various signals in the circuit 500 of FIG. 5 for typical operating conditions. Waveform 108 represents the clock signal 108 and consists of a first rising edge 604, a first falling edge, and additional rising and falling edges, each occurring periodically with a delay T between each rising edge and an equivalent delay T between each falling edge where T is the clock period. Waveform 136 first rising edge 612 occurs τ time units after waveform 108 first rising edge 604 which places waveform 136 first rising edge 612 occurring after waveform 108 second rising edge and before waveform 108 second falling edge. In FIG. 6A, τ is greater than T.

The process of stopping the clock is initiated by the clock signal 108 rising edge 604 which propagates through selector 110 to form signal 112 waveform 112 rising edge 610 which continues to propagate through clock distribution elements 114, 118, 124, 128, and 132 causing clock C2 136 rising edge 612. At this time, selector signal 566 is a logic low level which causes selector 110 to provide signal 108 to output signal 112. Clock signal 108 rising edge 604 also propagates through clock regenerator circuit 558 to form clock signal C1 552 waveform 552 first falling edge 606 and form clock signal C2 556 first rising edge 608. Signal 112 first rising edge 610 also propagates through clock regenerator circuit 544 to form clock signal C1 546 waveform 546 first falling edge 616 and form clock signal C2 548 waveform 548 first rising edge 622.

Clock signal C2 136 rising edge 612 causes storage circuit 144 to output signal 148 waveform 148 rising edge 614. Output signal 148 logic high level is provided as input to memory storage circuit 540. Output signal 148 logic high level provided as input to memory storage circuit 540 is stored in memory storage circuit 540 when clock signal C1 546 waveform 546 second falling edge occurs. Stored output signal 148 is provided to output signal 542 when clock signal C2 548 waveform 548 second rising edge 620 occurs, forming output signal 542 waveform 542 first rising edge 624. Output signal 542 logic high level is provided as input to memory storage circuit 550. Output signal 542 logic high level, provided as input to memory storage circuit 550, is stored in memory storage circuit 550 when clock signal C1 552 waveform 552 third falling edge 626 occurs.

Stored output signal 542 is provided to output signal 554 when clock signal C2 556 waveform 556 third rising edge 628 occurs, forming output signal 554 waveform 554 first rising edge 630. Output signal 554 logic high level is provided as input to latch 560. C1 552 is connected to both 550 and 560. Signal 554 rising edge 630 must wait for C1 552 rising edge 631 before propagating through memory storage circuit 560 to output selector signal 566. Clock signal C1 552 rising edge 631 causes latch 560 to provide selector signal 566 with signal 554 creating waveform 566 first rising edge 633. Selector signal 566 logical high level after rising edge 633 causes selector circuit 110 to output logic low level signal 142 to signal 112. When clock signal 108 fourth rising edge occurs, selector circuit 110 does not provide clock signal 108 to signal 112 due to the logic high level provided by selector signal 566.

Therefore, signal 112 remains at a logic low level 638 instead of the expected periodic clock signal 108 fourth rising and falling edges and subsequent rising and falling edges. Signal 112 logic low level 638 keeps clock signals at a static logic level as represented by clock C2 136 logic low level 632, clock C1 546 logic high level 634 and clock signal C2 548 logic low level 636 instead of the expected periodic clock pulses from clock signal 108 fourth rising and falling edges and subsequent rising and falling edges.

FIG. 6B represents the waveforms for various signals in the circuit 500 of FIG. 5 for fast operating conditions. Waveform 108 represents the clock signal 108 and consists of a first rising edge 642, a first falling edge, and additional rising and falling edges, each occurring periodically with a delay T between each rising edge and an equivalent delay T between each falling edge where T is the clock period. Waveform 136 first rising edge 644 occurs τ time units after waveform 108 first rising edge 642 which places waveform 136 first rising edge 644 occurring after waveform 108 first rising edge 642 and before waveform 108 second rising edge. In FIG. 6B, τ is less than T.

The process of stopping the clock is initiated by clock signal 108 rising edge 642 which propagates through selector 110 to form signal 112 waveform 112 first rising edge 656 which continues to propagate through clock distribution elements 114, 118, 124, 128, and 132 causing clock C2 136 rising edge 644. Selector signal 566 is a logic low level which causes selector 110 to provide signal 108 to output signal 112. Signal 112 first rising edge 656 also propagates through clock regenerator circuit 544 to form clock signal C1 546 waveform 546 first falling edge 648 and form clock signal C2 548 waveform 548 first rising edge 650. Clock signal C2 136 rising edge 644 causes storage circuit 144 to output rising edge 646 based on output signal 148. Output signal 148 logic high level is provided as input to memory storage circuit 540 and is stored in memory storage circuit 540 when clock signal C1 546 waveform 546 second falling edge occurs. Stored output signal 148 is provided to output signal 542 when clock signal C2 548 waveform 548 second rising edge 660 occurs, forming output signal 542 waveform 542 first rising edge 662. Output signal 542 logic high level is provided as input to memory storage circuit 550.

Output signal 542 logic high level, provided as input to memory storage circuit 550, is stored in memory storage circuit 550 when clock signal C1 552 waveform 552 third falling edge 664 occurs. Stored output signal 542 is provided to output signal 554 when clock signal C2 556 waveform 556 third rising edge 666 occurs, forming output signal 554 waveform 554 first rising edge 668. Output signal 554 logic high level is provided as input to latch 560. Clock signal C1 552 rising edge 669 causes latch 560 to provide selector signal 566 with signal 554 creating waveform 566 first rising edge 671. Selector signal 566 logical high level after rising edge 671 causes selector circuit 110 to provide logic low level signal 142 to signal 112. When clock signal 108 fourth rising edge occurs, selector circuit 110 does not provide clock signal 108 to signal 112 due to the logic high level provided by selector signal 566. Signal 112 remains at a logic low level 676 instead of the expected periodic clock signal 108 fourth rising and falling edges and subsequent rising and falling edges. Signal 112 logic low level 676 keeps all clocks signals at a static logic level as represented by clock C2 136 logic low level 670, clock C1 546 logic high level 672 and clock signal C2 548 logic low level 674 instead of the expected periodic clock pulses from clock signal 108 fourth rising and falling edges and subsequent rising and falling edges.

Therefore, the present invention solves the disadvantages associated with increasing clock distribution propagation delays due to larger electronic digital chips and reduced cycle times. These disadvantages make it difficult for a clock stopping signal initiated by the logic to stop the clock signal at the PLL output without disturbing the quality of the clock signal wave shape. The present invention eliminates these disadvantages by synchronously and deterministically transfers a control signal generated by clock stopping logic circuitry in the GCLK clocking domain to logic clocked by the output of the PLL circuit. The present invention may be used to stop the clock for testing, debugging, master checking of the chip, and power dissipation reduction management purposes.

The description of the present invention has been presented for purposes of illustration and description, and is not intended to be exhaustive or limited to the invention in the form disclosed. For example, latches and master/slave flip-flops are described but the present invention may use any type of data storage element. In addition, the memory storage circuits may be connected serially, in parallel or in any other functional combination. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated

What is claimed is:

1. A method of controlling a clock signal comprising the steps of:
   outputting a system clock signal utilizing a system clock generator that is in a first clock domain;
   providing a clock control signal from a storage device that is coupled to said system clock generator utilizing distribution logic, said storage device being in a second clock domain, said first and second clock domains differing by a time delay introduced by said distribution logic;
   synchronously and deterministically transferring said clock control signal from said second clock domain to said first clock domain utilizing signal transfer logic that includes a plurality of interconnected memory storage circuits, said clock control signal being received within said signal transfer logic which outputs an adjusted clock control signal; and
   outputting a controlled clock signal that is controlled by said adjusted clock control signal, said controlled clock signal having a deterministic number and size of clock pulses.

2. The method of claim 1, further comprising:
   inputting the adjusted clock control signal into a selector circuit; and outputting said controlled clock signal from said selector circuit.

3. The method in claim 2, wherein a selector circuit signal from the selector circuit keeps the controlled clock signal at a static logic level.

4. The method of claim 1, further comprising:
   installing logic circuit devices between the plurality of interconnected memory storage circuits.

5. The method of claim 1, further comprising:
   said signal transfer logic including a clock regenerator circuit coupled to said plurality of interconnected memory storage circuits;
   inputting the clock control signal into said signal transfer logic by inputting said clock control signal into said clock regenerator circuit;
   generating a regenerated signal by said clock regenerator;
   receiving said regenerated signal by said plurality of interconnected memory storage circuits; and
   outputting said adjusted clock control signal from said plurality of memory storage circuits in response to a receipt of said regenerated signal.

6. The method of claim 5, wherein an output from the clock regenerator circuit is at least one of a buffered clock control signal and a logically inverted clock control signal.

7. The method of claim 1, wherein the plurality of memory storage circuits is a plurality of latches.

8. The method of claim 1, wherein the plurality of memory storage circuits is a plurality of latches and master/slave flip-flops.

9. The method of claim 1, further comprising:
   outputting said adjusted clock control signal from the signal transfer logic when the clock control signal is at a logical high level;
   storing a clock signal in the signal transfer logic when the clock control signal transitions from a logical high level to a logical low level; and
   outputting said adjusted clock control signal from the signal transfer logic based on the stored clock signal when the clock control signal is at a logical low level.

10. The method according to claim 1, wherein said system clock generator is a phase locked loop (PLL).

11. A system of controlling a clock signal comprising:
    a system clock generator in a first clock domain for outputting a system clock signal;
    said system clock generator being coupled to distribution logic that is coupled to a storage device, said storage device being in a second clock domain, said first and second clock domains differing by a time delay introduced by said distribution logic, said storage device providing a clock control signal;
    signal transfer logic that includes a plurality of interconnected memory storage circuits for synchronously and deterministically transferring said clock control signal from said second clock domain to said first clock domain, said clock control signal being received within said signal transfer logic which outputs an adjusted clock control signal; and
    a circuit for outputting a controlled clock signal that is controlled by said adjusted clock control signal, said controlled clock signal having a deterministic number and size of clock pulses.

12. The system of claim 11, further comprising:
    said circuit for outputting said controlled clock signal being a selector circuit; and
    said selector circuit for receiving said adjusted clock control signal.

13. The system of claim 12, wherein a selector circuit signal from the selector circuit keeps the controlled clock signal at a static logic level.

14. The system of claim 11, further comprising:
    a means for installing logic circuit devices between the plurality of interconnected memory storage circuits.

15. The system of claim 11, further comprising:
    said signal transfer logic including a clock regenerator circuit coupled to said plurality of interconnected memory storage circuits;
    said clock control signal being input into said signal transfer logic by inputting said clock control signal into said clock regenerator circuit;
    said clock regenerator generating a regenerated signal;
    said plurality of interconnected memory storage circuits receiving said regenerated signal; and
    said plurality of memory storage circuits outputting said adjusted clock control signal.

16. The system of claim 15, wherein an output from the clock regenerator circuit is at least one of a buffered clock control signal and a logically inverted clock control signal.

17. The system of claim 11, wherein the plurality of memory storage circuits is a plurality of latches.

18. The system of claim 11, wherein the plurality of memory storage circuits is a plurality of latches and master/slave flip-flops.

19. The system of claim 11, further comprising:
    a means for outputting said adjusted clock control signal from the signal transfer logic when the clock control signal is at a logical high level;
    a means for storing a clock signal in the signal transfer logic when the clock control signal transitions from a logical high level to a logical low level; and
    a means for outputting said adjusted clock control signal from the signal transfer logic based on the stored clock signal when the clock control signal is at a logical low level.

20. The system according to claim 11, wherein said system clock generator is a phase locked loop (PLL).

* * * * *